United States Patent [19]
Marquardt et al.

[11] Patent Number: 5,213,627
[45] Date of Patent: May 25, 1993

[54] STRUCTURAL ELEMENT, IN PARTICULAR FACADE ELEMENT

[75] Inventors: Reinhold Marquardt; Walter Böhmer, both of Gelsenkirchen; Horst Harzheim; Wolfgang Jäger, both of Witten; Oussama Chehab, Neuss; Reiner Rosendahl, Krefeld, all of Fed. Rep. of Germany

[73] Assignee: Flachglas-Solartechnik GmbH, Cologne, Fed. Rep. of Germany

[21] Appl. No.: 764,510

[22] Filed: Sep. 20, 1991

[30] Foreign Application Priority Data

Sep. 20, 1990 [DE] Fed. Rep. of Germany ....... 4029822

[51] Int. Cl.⁵ ......................................... H01L 31/048
[52] U.S. Cl. ..................... 136/251; 52/171; 52/788; 52/789; 52/790; 428/34
[58] Field of Search .......... 136/251; 52/171, 788–790; 428/34

[56] References Cited

U.S. PATENT DOCUMENTS 5,128,181  7/1992  Kunert .................... 428/34

FOREIGN PATENT DOCUMENTS 3801989  7/1989  Fed. Rep. of Germany ...... 136/251

Primary Examiner—Aaron Weisstuch
Attorney, Agent, or Firm—Sughrue, Mion, Zinn, Macpeak & Seas

[57] ABSTRACT

In a structural element, in particular a facade element with an outside plate sandwich, in which solar cells are arranged between an outer plate and an inner plate, and with another internal plate, which is provided at a distance from the plate sandwich by means of a spacing frame defining the interior, the solar cells are embedded in a layer of casting resin; furthermore, the inner plate recedes in its dimensions in the region of at least one edge at least partially with respect to the corresponding edge of the outer plate and forms thus a recess that also reaches over the layer of casting resin and through which the necessary electrical lines are guided, whereby the recess in the direction of the interior of the structural element is covered by the spacing frame. As an alternative, the outer plate can recede with respect to the inner plate.

2 Claims, 5 Drawing Sheets

STRUCTURAL ELEMENT, IN PARTICULAR FACADE ELEMENT

FIELD OF THE INVENTION

The invention relates to a structural element, in particular a facade element, with an outside plate sandwich, in which solar cells are arranged between an outer plate and an inner plate, and with another internal plate, which is provided at a distance from the plate sandwich by means of a spacing frame defining the interior.

BACKGROUND OF THE INVENTION

Such a structural element is known from the EP-A 0 382 060 and is used to line walls and roofs and also for windows and parapets. Especially for the observer located in the building, such structural elements are, however, often not pleasing aesthetically, since the solar cells that are used are virtually opaque.

Furthermore, it is desirable that the structural or facade elements provide a high acoustical and thermal insulation. In addition, known structural elements provide a vacuum in the space between the outside plate sandwich and the internal plate or also introduce an inert gas for absorbing the thermal radiation. To prevent the radiation of heat into the interior of the building, a low E coating is applied as a heat insulating layer on the inner surface of the inner plate. These measures bring about heat transfer values as low as 1.3 W/m²K, moreover as a function of the dimensions of the structural element, especially the distance between the inner plate of the sandwich and the other internal plate.

The object of the invention is to provide a structural element that is aesthetically appealing from the outside and inside, has a high acoustical and thermal insulation, and can be manufactured simply and economically.

According to the invention, the solar cells are embedded in a layer of casting resin; furthermore, the inner plate recedes in its dimensions in the region of at least one edge at least partially with respect to the corresponding edge of the outer plate and forms thus a recess that also reaches over the layer of casting resin and through which the necessary electrical lines for the solar cells are guided, whereby the recess in the direction of the interior of the structural element is covered by the spacing frame and the interior seal.

As an alternative, the outer plate recedes in its dimensions in the region of at least one edge at least partially with respect to the corresponding edge.

Embedding the solar cells in a layer of casting resin produces a sandwich that is not only economical to manufacture but also is characterized by the fact that the solar cells are held absolutely stable in position. The stepped design of the plates of the plate sandwich makes it possible to lead the electrical lines in a simple and reliable manner out of the structural element. Since the step is covered by the spacers that are necessary in any event, the overall aesthetic effect of the structural element is not impaired. An especially suitable casting resin is a well-known highly transparent sound proof casting resin based on acrylate. Since good sound proofing properties also coincide usually with good heat insulating properties, with these measures alone a very good insulated structural element is obtained.

It is advantageous to supplement the internal plate with a second plate having an intermediate layer of sound proof casting resin, forming an inside plate sandwich. In this manner, not only the insulating properties that were good in any event are improved. If a light scattering sound proof casting resin is used, this causes a frosted glass effect, thus preventing the view from the interior of the building of the back side of the solar cells in the exterior sandwich. The same effect is obtained, if when using the internal plate alone this internal plate is made of frosted glass or if in the case of the inside plate sandwich at least one of the plates is frosted.

Solar cells, whose maximum absorption preferably for sunlight lies in a spectral range that differs from that of the solar cells of the outside plate sandwich, can also be embedded into the intermediate layer. Logically the solar cells of the inside plate sandwich are offset relative to those of the outside plate sandwich. It is also recommended that the electrical lines for this second solar cell arrangement be led in the same or similar manner out of the plate sandwich as already explained for the outside plate sandwich. In such an embodiment the plate of the inside plate sandwich that is arranged in the direction of the building interior will be frosted.

The outer plate of the external plate sandwich is made preferably of at least in part chemically or thermally prestressed glass, where a flint glass that is poor in iron has proven to be especially suitable. An outer plate made of plastic is also conceivable, where the security against fracture is increased. Together with the highly transparent layer of casting resin, high transparency is ensured, so that no only the solar cells of the outside plate sandwich but also optionally those of the inside plate sandwich can contribute optimally to the harnessing of energy.

The thermal insulation is further improved if the space between the outside sandwich and the internal plate is filled with a gas of low thermal conductivity, for example with dried air, with sulfur hexafluoride or with a mixture of these media.

For the configuration of the solar cells the possibilities are virtually unlimited. With respect to an optimal harnessing of energy it is advantageous to configure the solar cells of the outside plate sandwich in such a manner that the plate surface is substantially covered. In so doing, the outer regions of the plate sandwich are excluded in which the casting resin located there exclusively fixes in position the outer plate and the inner plate.

As solar cells, polycrystalline or amorphous solar cells can be used, where in each plate sandwich one type of solar cell or a combination of both types of solar cells is embedded. The solar cells are arranged advantageously on the casting resin side on the surface of the plates, a feature that is suitable especially for amorphous thin layer solar cells.

If amorphous thin layer solar cells, which exhibit an extensive transparency for light in the visible range, are provided at least in the outside plate sandwich, the aesthetic impression of the facade element is further improved, but losses in the obtainable energy must be accepted. On the whole, the structural element according to the invention has the advantage of especially high transparency, if a specially designed light scattering layer is provided.

If only the outside plate sandwich is provided, the irradiation of the infrared portion of the solar spectrum can be prevented by applying a solar insulating coating on the inner plate relative to the space between the outside sandwich and the internal plate.

In each of the described embodiments a thermal protective coating can also be applied on the internal plate.

To cover the solar cells in the direction of the building interior, a surface imprinting can be applied to the surface of the plates.

Suitable material for the inner plate and optionally the plates of the inside plate sandwich is normal prestressed glass. Within the inventive idea, structural elements of the invention can also be used in framed format—optionally from a production point of view.

In the following the invention shall be described by means of examples with the aid of the accompanying drawings.

Figure 1:
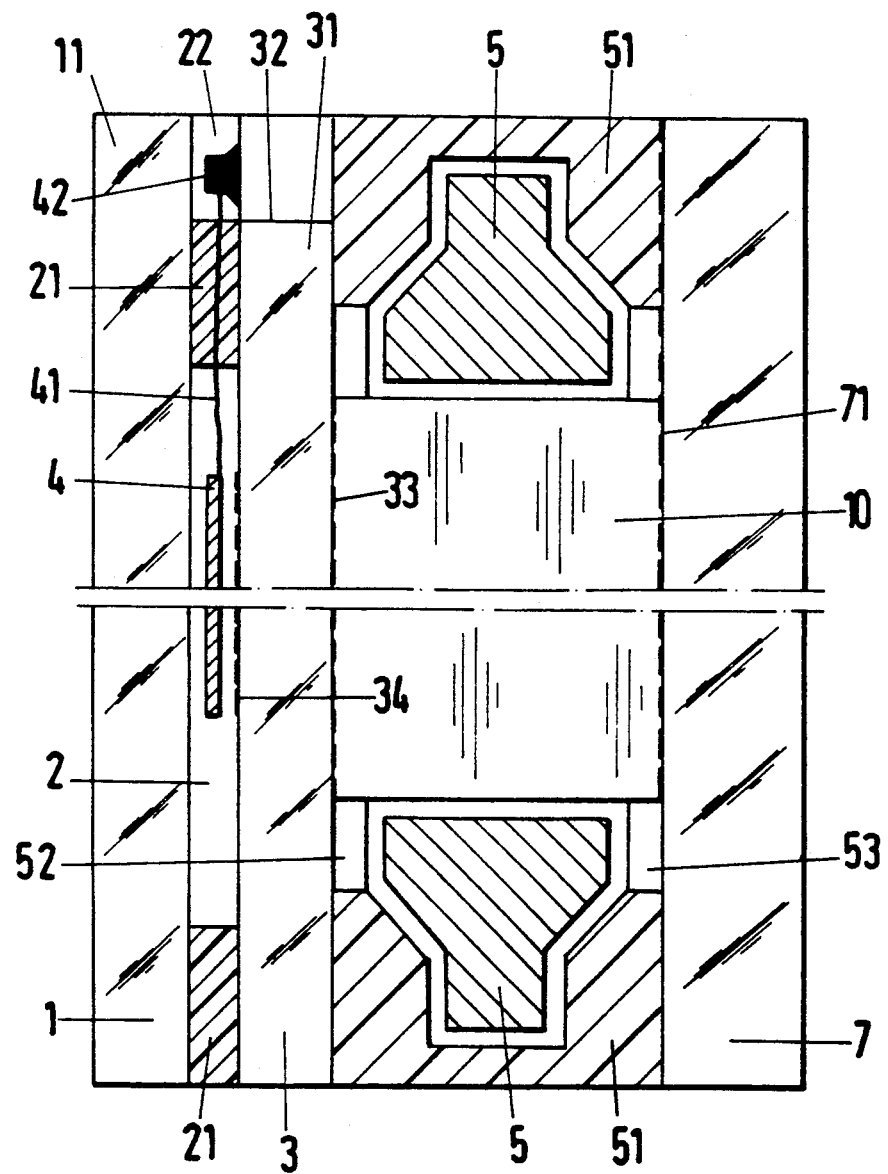
FIG. 1 is a sectional view of a structural element according to the present invention.

The structural element of FIG. 1 comprises an outside plate sandwich in which a casting resin layer 2 of highly transparent sound proof casting resin is provided between an outer plate 1 and an inner plate 3. Solar cells 4 are arranged in the casting resin layer 2, a feature that is shown here only by means of a schematic drawing. An outer seal 21 seals the casting resin layer 2. In the upper region 31 the inner plate 3 recedes behind the corresponding region 11 of the outer plate, so that a recess 32 is formed that also extends over the casting resin layer 2 or the outer seal 21. Through this recess 32 all of the electrical leads, embedded in adhesive, are led out of the structural element. In so doing, the connecting leads 41 for the solar cells 4 are led to a common bus bar 42, which lies within the recess 32. The bus bar 42 can lie in the adhesive or be arranged at the outer plate 1.

This entire cable connection is provided with a cover strip 22. Enclosed in sealing strips 52, 53, a spacing frame 5, which defines the distance to another plate 7, called the internal plate, rests on the outside plate sandwich. By means of this arrangement an interior 10 is formed that is filled, e.g., with dried air or sulfur hexafluoride ($SF_6$). An interior seal 51, enclosing the spacing frame 5, provides for a gas-tight closure of the interior 10 towards the outside. The dimensions of the spacing frame 5 are selected in such a manner that said spacing frame covers the outer seal 21 and the cable connections with the cover strip 22 of the outside sandwich. Therefore, the overall aesthetic impression of the structural element is not impaired especially by the lead-out of the electrical lines. If it should not be desired that solar cells 4 be visible from the building interior, a surface imprinting 34 that covers in an optically appealing manner the solar cell configuration can be provided on the inner plate 3 on the casting resin side. The internal plate 7 is, for example, a single prestressed plate made of normal glass. A thermal insulating coating 71 is applied on said single plate in the direction of the interior 10. In this embodiment of the structural element it is advantageous, as occurred here, to provide the surface of the inner plate 3, facing the interior 10, with a solar protective coating 33.

Figure 2:
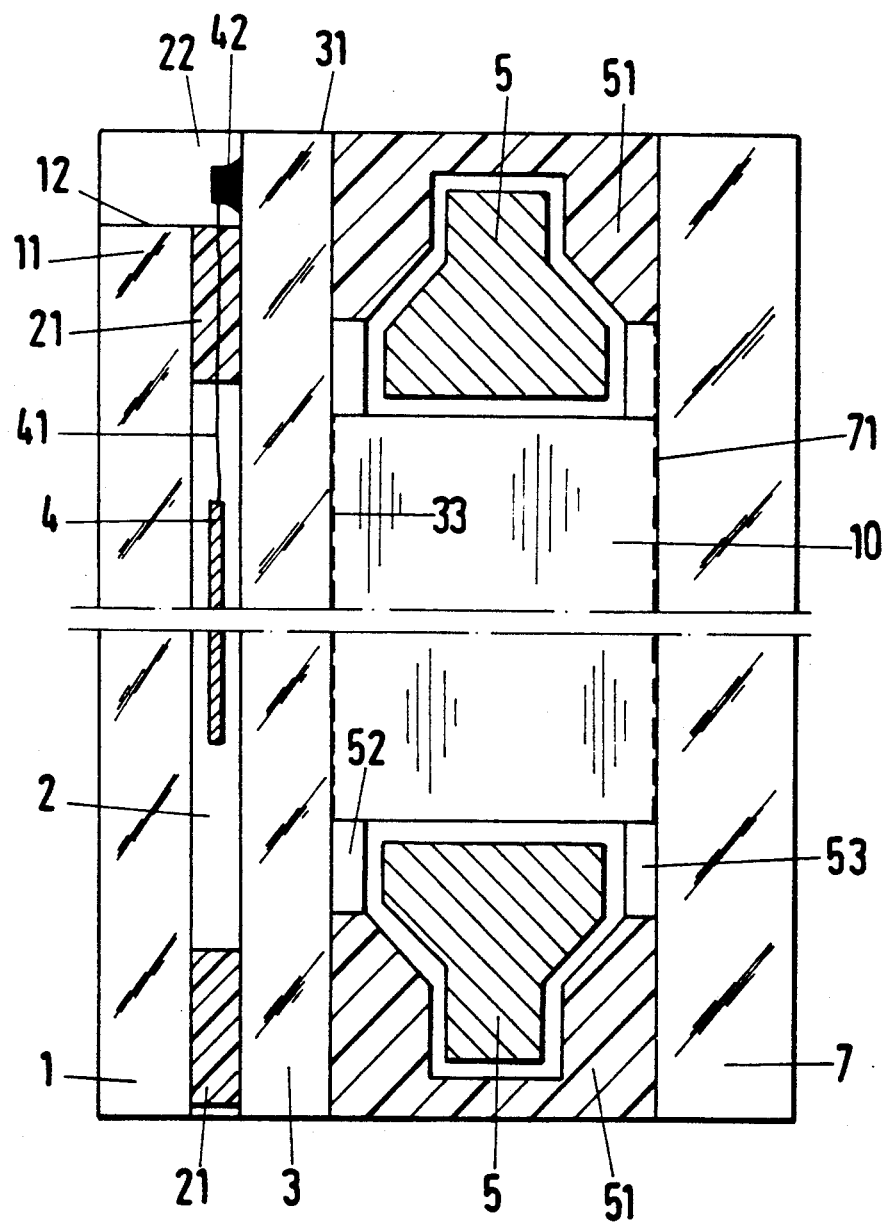
FIG. 2 is a sectional view of a second embodiment.

In the facade element according to FIG. 2, the outer plate in the region of the upper edge 11 recedes relative to the edge 31 of the inner plate 3 and forms a recess 12 that also reaches over the casting resin layer 2 and into which the cable connection with cover strip is laid. The bus bar 42 is arranged here directly at the part of the inner plate 3 adjacent to the recess 12. Otherwise, this embodiment matches that of FIG. 1, so that reference is made to the description relative to FIG. 1. Of course, a plate made of frosted glass is provided as the internal plate 7, so that a surface imprinting is not suitable as in FIG. 1.

Figure 3:
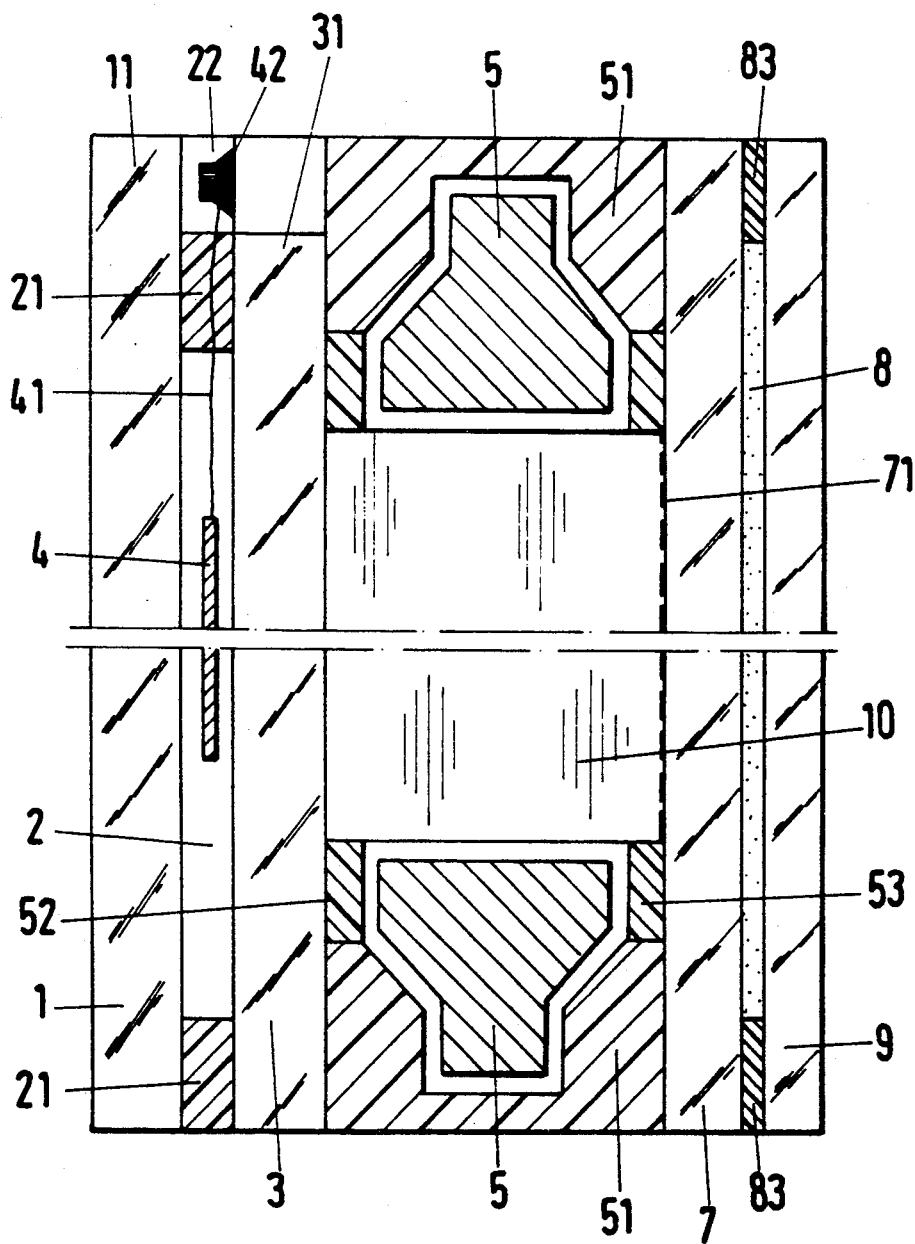
FIG. 3 is a sectional view of another embodiment of the structural element with an inside plate sandwich.

FIG. 3 shows a second embodiment of the facade element according to the present invention in which the internal plate 7 is supplemented with an intermediate layer 8 and another plate 9, forming an inside plate sandwich. The design of the outside plate sandwich corresponds to that of FIG. 1, but the inner plate 3 is not provided with either a solar protective coating 33 or a surface imprinting 34. The function of these two coatings is now assumed by the intermediate layer 8, for which a light scattering casting resin is used, so that a frosted glass effect is achieved. The casting resin layer 8 is provided in turn with outer seals 82, 83 in the direction of the edges of the structural element. As in the case of the above described embodiment, a thermal insulating coating 71 is applied on the internal plate 7.

For this embodiment of the invention, using air as the filling, a heat transmission value $k = 1.7$ W/$m^2$/K is obtained. The transparency TL amounts to 9% when polycrystalline solar cells are used. The total energy transmission g is 10%. The assessed sound reduction index Rw is at 43 dB. If the interior is filled with sulfur hexafluoride, a value of 48 dB is obtained.

Figure 4:
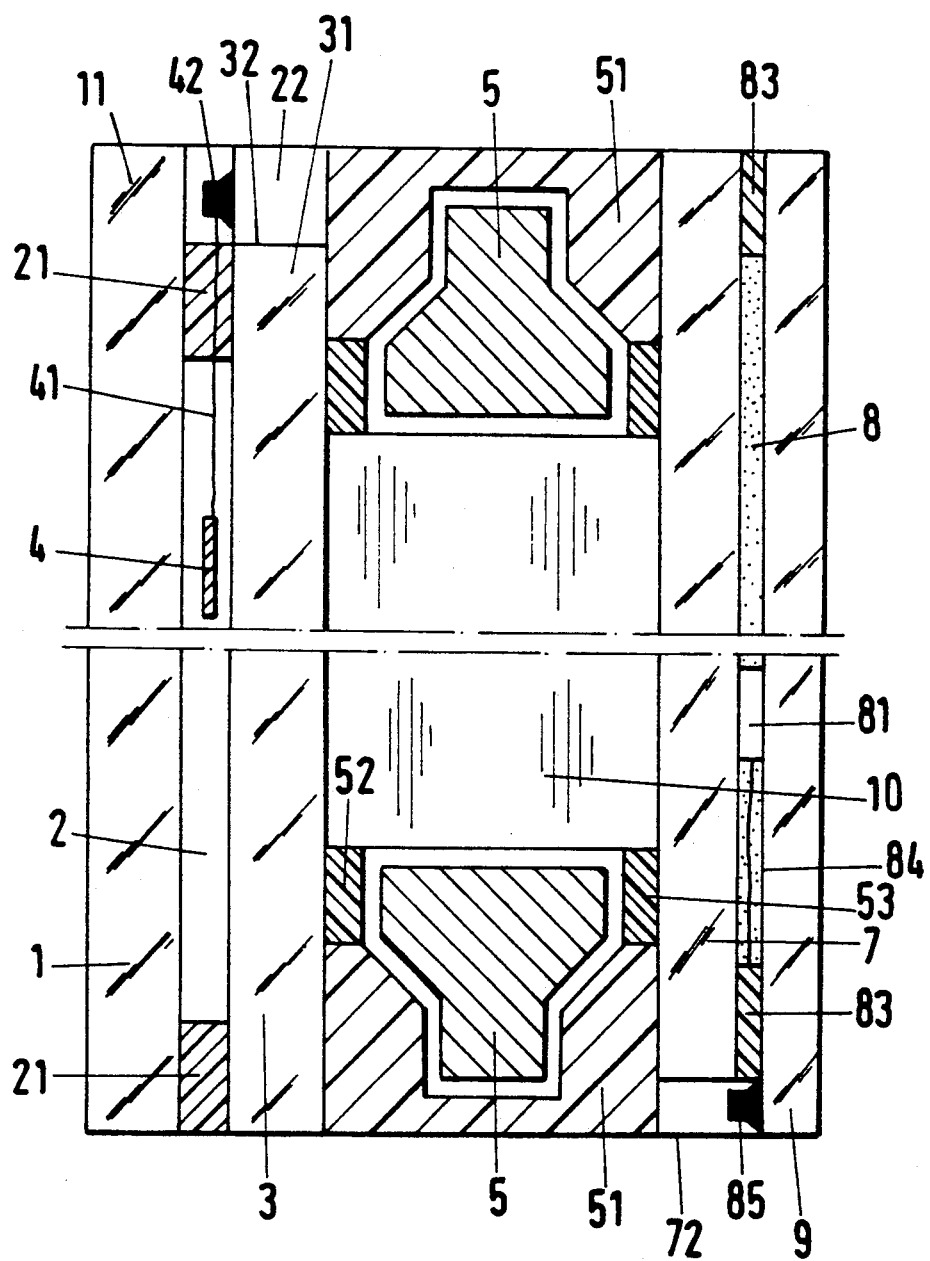
FIG. 4 is a sectional view of a fourth embodiment of the structural element of the invention in which the solar cells are also provided in the inside plate sandwich.

The embodiment according to FIG. 3 can be further modified according to FIG. 4 by embedding other solar cells 81 in the casting resin layer 8, as shown in FIG. 3. These solar cells can be provided, for example, in the bottom region of the structural element, whereas the solar cells 4 of the outside sandwich are provided only in the upper region of the structural element. Other arrangements of the solar cells 4, 81 are also conceivable, in which their respective surfaces are not covered. The connecting leads 84 for the solar cells 81 of the inside sandwich are led to a bus bar 85, which, as described with respect to FIG. 1, is also covered optically by the spacing frame 5. In turn it is advantageous to recess the bottom region of the internal plate 7 behind the plate 9, so that the electrical leads can be led out of the structural element via a recess 72 produced thus.

Figure 5:
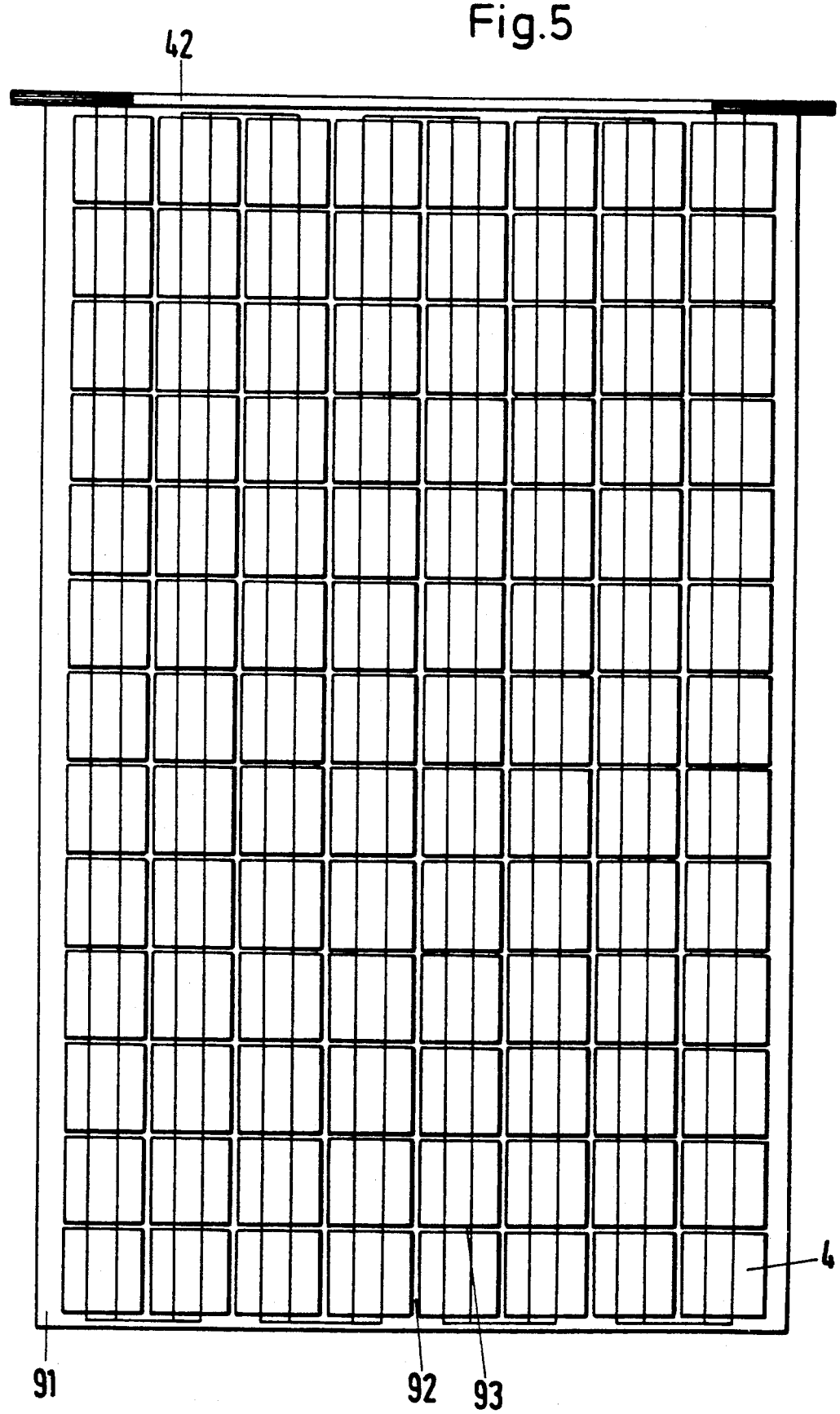
FIG. 5 is a front view of a structural element according to the invention.

FIG. 5 is a front view of a structural element according to the invention. Polycrystalline solar cells 4 are combined into units of the size $10 \times 10$ $cm^2$. The spaces 92, 93 between these cell units are light transmissive, similarly the outer region 91, which encloses the entire structural element. The bus bar 42 on the upper side of the structural element consolidates the electrical leads.

In all of the described embodiments the outside plate sandwich can be designed as an alarm plate according to DE-PS 36 37 989.

The features of the invention disclosed in the above description, in the drawings, and in the claims can be important both individually and in any combination for the actualization of the invention in its various embodiments.

What is claimed is:

1. Structural element, in particular a facade element, with an outside plate sandwich, in which solar cells are arranged between an outer plate (1) and an inner plate (3), and with another internal plate (7), which is provided at a distance from the outside plate sandwich by means of a spacing frame (5) defining an interior space (10), wherein the solar cells (4) are embedded in a casting resin layer (2); and wherein the inner plate (3) recedes in its dimensions in the region of at least one edge (31) at least partially with respect to the corresponding edge (11) of the outer plate (1) and forms thus a recess (32) that also extends through the casting resin layer (2) and through which the necessary electrical output leads (42) are guided, whereby the recess (32), in the direction of the interior of the structural element, is covered by the spacing frame (5) and an interior seal (51).

2. Structural element, in particular a facade element, with an outside plate sandwich, in which solar cells are arranged between an outer plate (1) and an inner plate (3), and with another internal plate (7), which is provided at a distance from the outside plate sandwich by means of a spacing frame (5) defining an interior space (10), wherein the solar cells (4) are embedded in a casting resin layer (2); and wherein the outer plate (1) recedes in its dimensions in the region of at least one edge (11) at least partially with respect to the corresponding edge (31) of the inner plate (3) and forms thus a recess (12) that also extends through the casting resin layer (2) and through which the necessary electrical output leads (42) are guided, whereby the recess (12), in the direction of the interior of the structural element, is covered by the spacing frame (5) and an interior seal (51).

* * * * *